United States Patent
Wu et al.

(10) Patent No.: US 8,929,007 B2
(45) Date of Patent: Jan. 6, 2015

(54) COLOR FILTER AND MANUFACTURING METHOD THEREOF

(75) Inventors: Hongjiang Wu, Beijing (CN); Chongxi Wei, Beijing (CN); Yiming Chen, Beijing (CN); Seungmoo Rim, Beijing (CN); Xibin Shao, Beijing (CN)

(73) Assignees: BOE Technology Group Co., Ltd., Beijing (CN); Beijing BOE Display Technology Co., Ltd., Beijing (CN)

( * ) Notice: Subject to any disclaimer, the term of this patent is extended or adjusted under 35 U.S.C. 154(b) by 0 days.

(21) Appl. No.: 13/466,472

(22) Filed: May 8, 2012

(65) Prior Publication Data

US 2012/0287523 A1 Nov. 15, 2012

(30) Foreign Application Priority Data

May 10, 2011 (CN) .......................... 2011 1 0119793

(51) Int. Cl.
*G02B 5/22* (2006.01)
*G02B 5/20* (2006.01)
*G03F 7/00* (2006.01)

(52) U.S. Cl.
CPC .............. *G02B 5/201* (2013.01); *G03F 7/0007* (2013.01)
USPC ........... 359/891; 359/890; 359/887; 359/885; 359/888

(58) Field of Classification Search
USPC ............................ 359/887, 890; 349/108, 109
See application file for complete search history.

(56) References Cited

U.S. PATENT DOCUMENTS

| | | |
|---|---|---|
| 2006/0019181 A1 | 1/2006 | Lin et al. |
| 2006/0028599 A1 | 2/2006 | Fukuchi |
| 2006/0285035 A1* | 12/2006 | Tsuchiya et al. .............. 349/106 |
| 2009/0015770 A1* | 1/2009 | Ito et al. ......................... 349/108 |
| 2010/0134710 A1* | 6/2010 | Ishitani et al. .................. 349/46 |
| 2010/0302482 A1 | 12/2010 | Takahashi et al. |
| 2011/0269075 A1 | 11/2011 | Wang et al. |

FOREIGN PATENT DOCUMENTS

| | | |
|---|---|---|
| CN | 101840013 A | 9/2010 |
| CN | 101861533 A | 10/2010 |
| JP | 2006-284757 A | 10/2006 |
| JP | 2008-281919 A | 11/2008 |
| JP | 2009-086617 A | 4/2009 |

OTHER PUBLICATIONS

First Chinese Office Action dated Oct. 28, 2013; Appln. No. 201110119793.5.
Second Chinese Office Action dated Apr. 17, 2014; Appln. No. 201110119793.5.
Third Chinese Office Action dated Jul. 2, 2014; Appln. No. 201110119793.5.
Chinese Rejection Decision dated Oct. 16, 2014; Appln. No. 201110119793.5.

* cited by examiner

*Primary Examiner* — Scott J Sugarman
*Assistant Examiner* — William Alexander
(74) *Attorney, Agent, or Firm* — Ladas & Parry LLP

(57) ABSTRACT

A color filter and a manufacturing method thereof are provided, in which a stacked structure composed of several color film layers having different colors is formed in a non-transmitting partitioning region of the color filter in such a way that the stacked structure can prevent light from passing through the color filter via the partitioning region.

14 Claims, 5 Drawing Sheets

COLOR FILTER AND MANUFACTURING METHOD THEREOF

TECHNICAL FIELD

The present disclosure relates to display technologies, in particular, to color filter and manufacturing method thereof

BACKGROUND

With the development of display technologies, high transmittance, large size, low-power consumption, low-cost become directions of future development. A color filter as a main constituent part of a display device has its structure as shown in FIG. 1 and FIG. 2.

Among them, FIG. 1 is a structural schematic view of a color filter in the prior art, with its structure mainly comprising a glass substrate 1, a black matrix 2, a red film layer 3, a green film layer 4 and a blue film layer 5. FIG. 2 is a schematic view along cross-section A-A in FIG. 1.

The manufacturing processes of the color filters in the prior art are: first applying photoresist for the black matrix on the glass substrate; then forming a black matrix grid film layer as shown in the figures with processes of exposing and developing, etc.; thereafter forming a red, a green, and a blue matrix film on the black matrix grid film layer, respectively.

The disadvantages of the prior art are presented in the facts of: 1. comparatively complex processes and rather long production cycle; 2. need of raw materials of photoresist for producing the black matrix, and thus high production costs; 3. more initial investment in equipments and rather high risks.

SUMMARY

Some embodiments of the present disclosure provide a method for manufacturing a color filter which comprises a plurality of pixels each having more than one sub-pixel light-transmitting regions and a non-transmitting partitioning region. The method comprises: forming a stacked structure composed of several color film layers having different colors in the non-transmitting partitioning region of the color filter in such a way that the stacked structure can prevent light from passing through the color filter via the partitioning region.

Some other embodiments of the present disclosure provide a color filter which comprises a plurality of pixels each having more than one sub-pixel light-transmitting regions and a non-transmitting partitioning region, and in which, the non-transmitting partitioning region is provided with a stacked structure composed of several color film layers having different colors, for preventing light from passing through the color filter via the partitioning region.

Further scope of applicability of the present disclosure will become apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the following detailed description.

BRIEF DESCRIPTION OF THE DRAWINGS

The present disclosure will become more fully understood from the detailed description given hereinafter and the accompanying drawings which are given by way of illustration only, and thus are not limitative of the present disclosure and wherein.

DETAILED DESCRIPTION OF THE PREFERRED EMBODIMENTS

A color filter comprises a plurality of pixels, each having more than one light-transmitting regions and a non-transmitting partitioning region. According to embodiments of the present disclosure, it is possible to form a stacked structure in the non-transmitting partitioning region of a color filter with a partial exposure technology, so as to prevent light emitted from a backlight from passing through the non-transmitting partitioning region, and thereby eliminating a black matrix forming process while providing the technical effects of a black matrix, and thus solving technical issues such as complex processes and high-costs, etc. in a manufacturing procedure of a color filter.

It should be noted that, the above operations are directed to a color filter, therefore the specific colors may comprise at lease two colors of the three primary colors of red, green, and blue, or may comprise colors other than the three primary colors of red, green, and blue.

Figure 1:
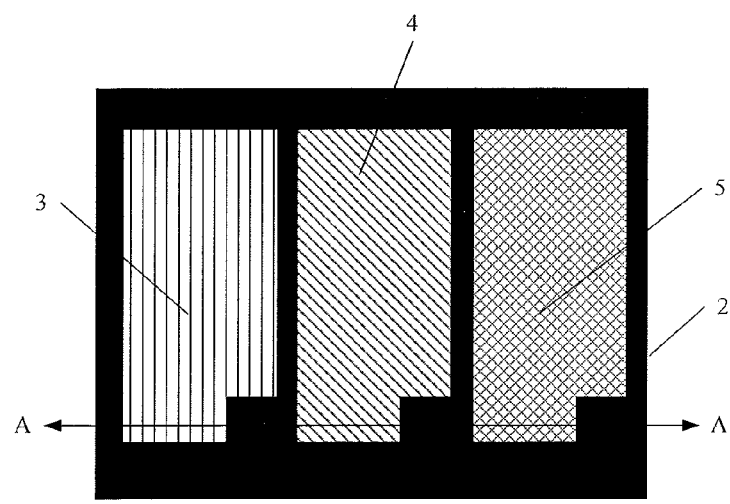
FIG. 1 is a structural schematic view of a color filter in the prior art.
Figure 2:
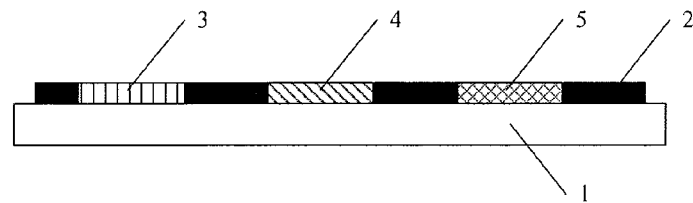
FIG. 2 is a schematic view along the cross-section A-A in FIG. 1.
Figure 3:
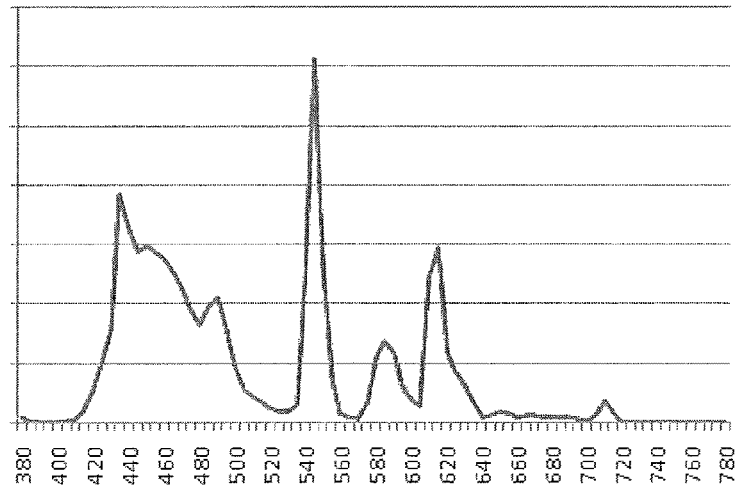
FIG. 3 is a schematic view of a backlight spectrum in the prior art.
Figure 4:
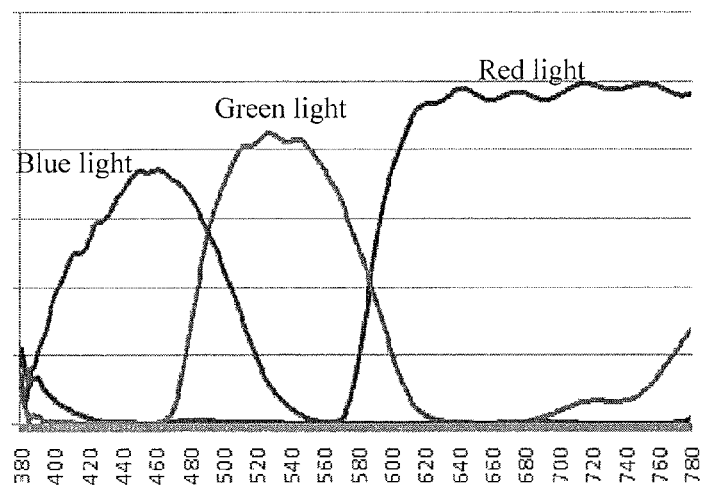
FIG. 4 is a schematic view of spectral curves of color photoresist in the prior art.

It can be seen from FIG. 3 and FIG. 4 that, after applying the operations described above, light emitted from a backlight can not pass through the regions where the film layers of the three colors of red, green, and blue are stacked due to the overlapping of the three colors of red, green, and blue, which can achieve the aim of eliminating the black matrix forming process. Specifically, FIG. 3 shows a spectrum distribution of wavelengths from 380 nm to 780 nm; FIG. 4 shows spectral curves of wavelengths from 380 nm to 780 nm.

The structure of the color filter in the present embodiment mainly comprises: a glass substrate and several color film layers, wherein the color film layers are formed with color photoresist by using partial exposure technology in a color filter exposing process, and form partially exposed film layers successively in the non-transmitting partitioning region, so as to form a stacked structure in the partitioning region. The stacked structure functions to block light, so as to prevent light emitted from a backlight from passing through the color filter via the partitioning region. Thus, it is possible to eliminate a black matrix forming process while providing function of a black matrix.

Figure 5:
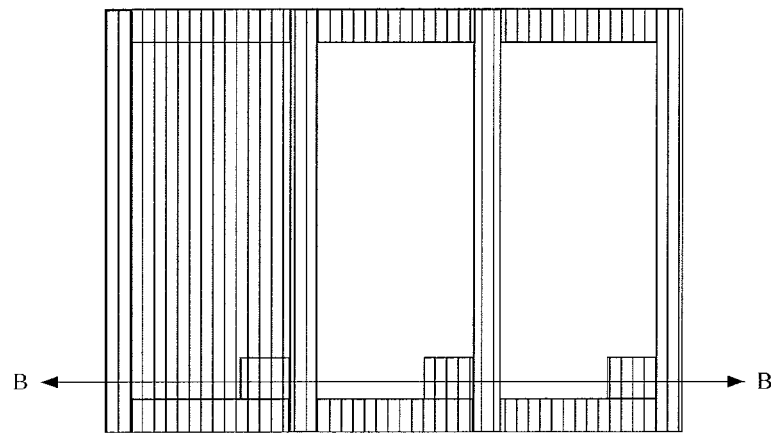
FIG. 5 is a schematic view of the entire exposure region of a red photoresist in the present disclosure.
Figure 6:
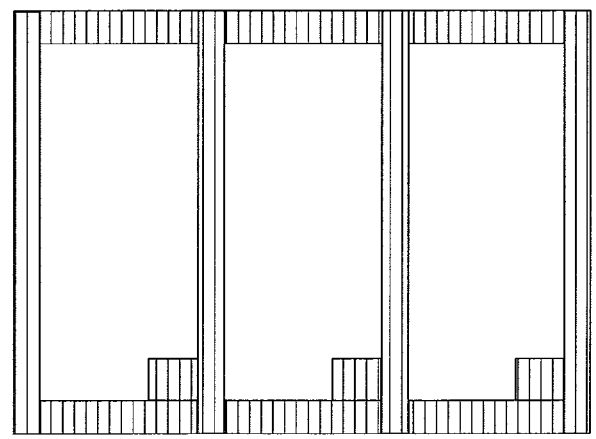
FIG. 6 is a schematic view of a region of partial exposure of the red photoresist in FIG. 5.
Figure 7:
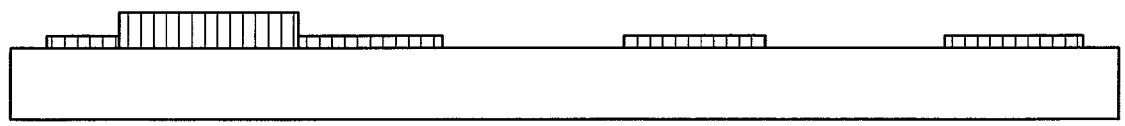
FIG. 7 is a schematic view along the cross-section B-B in FIG. 5.

Specifically, first evenly apply a layer of red photoresist on a glass substrate. In the present embodiment as shown in FIG. 5, exposure is performed by using an exposure machine, wherein the sub-pixel light-transmitting regions are fully exposed or not exposed, and as shown in FIG. 6, the non-transmitting region is partially exposed. The region shown in FIG. 6 is subjected to the partial exposing process, and then subjected to a developing process and a drying process. A red film layer pattern as shown in FIG. 5 is formed on the surface of the glass substrate (denoted in the figure as a pattern filled with vertical lines). FIG. 7 is a schematic view along the cross-section B-B in FIG. 5 after exposure.

Figure 8:
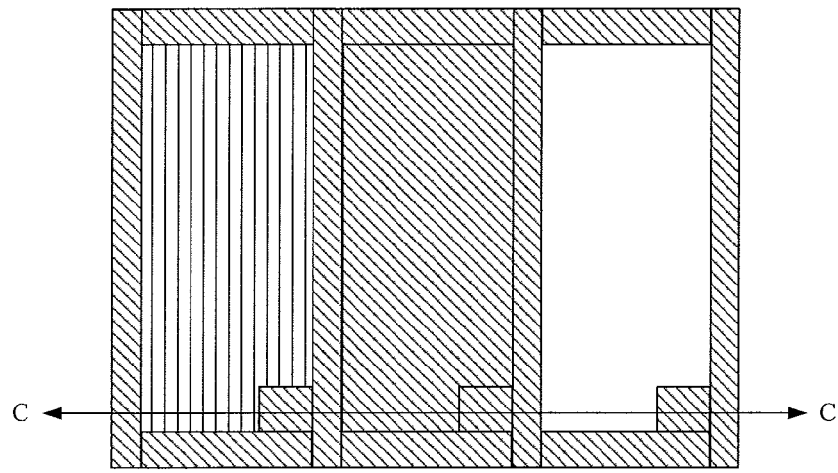
FIG. 8 is a schematic view of the entire exposure region of a green photoresist in the present disclosure.
Figure 9:
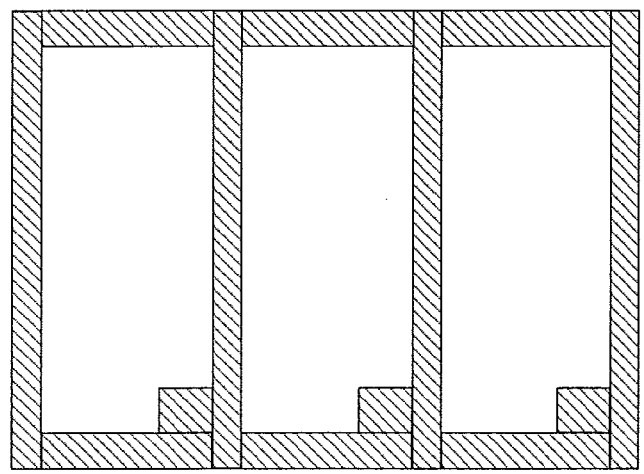
FIG. 9 is a schematic view of a region of partial exposure of the green photoresist in FIG. 8.
Figure 10:
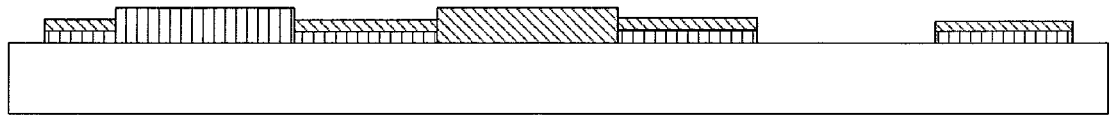
FIG. 10 is a schematic view along the cross-section C-C in FIG. 8.

After the process of the red film layer is completed, perform the same processes as those to the red film layer to a green film layer. Specifically, first apply a layer of green photoresist. In the present embodiment as shown in FIG. 8, exposure is performed by using an exposure machine, wherein the sub-pixel light-transmitting regions are fully exposed or not exposure, and as shown in FIG. 9, the non-transmitting region is partially exposed. The region shown in FIG. 9 is subjected to the partial exposing process, and then subjected to a developing process and a drying process. A green film layer pattern as shown in FIG. 8 is formed on the surface of the glass substrate (denoted in the figure as a pattern filled with oblique lines). FIG. 10 is a schematic view along the cross-section C-C in FIG. 8 after exposure.

Figure 11:
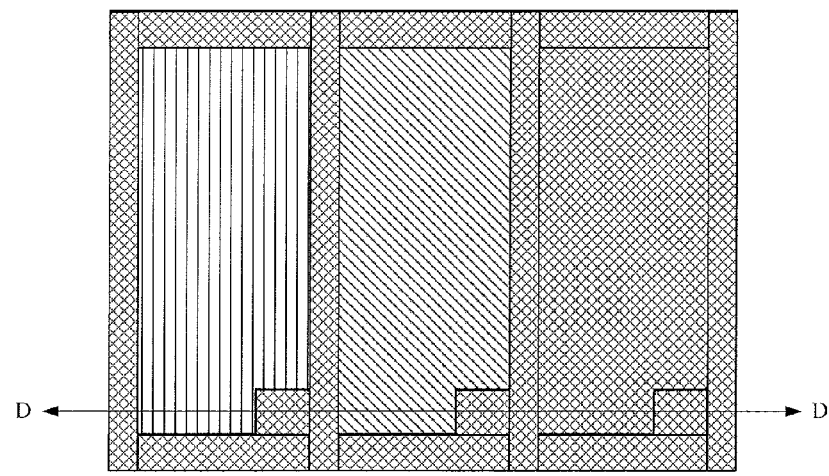
FIG. 11 is a schematic view of the entire exposure region of a blue photoresist in the present disclosure.
Figure 12:
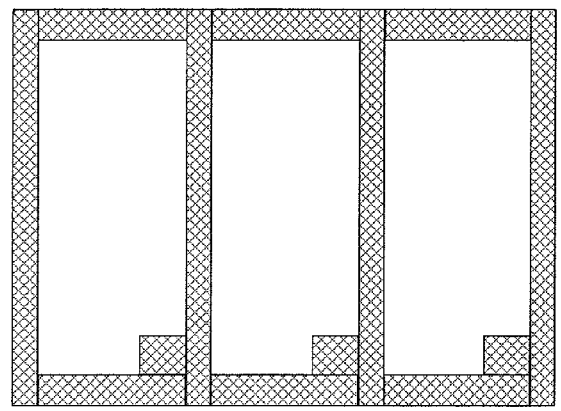
FIG. 12 is a schematic view of a region of partial exposure of the red photoresist in FIG. 11.
Figure 13:
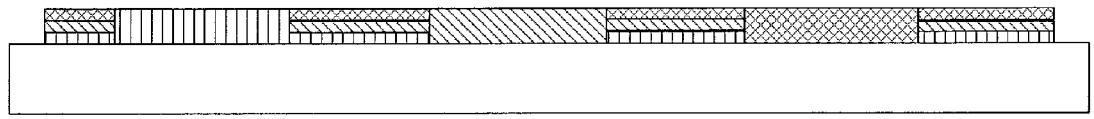
FIG. 13 is a schematic view along the cross-section D-D in FIG. 11.

After the process of the green film layer is completed, perform the same processes as those to the red and the green film layers to a blue film layer. Specifically, first apply a layer of blue photoresist. In the present embodiment as shown in FIG. 11, exposure is formed by using an exposure machine, wherein the sub-pixel light-transmitting regions are fully exposed or not exposed, and as shown in FIG. 12, the non-transmitting region is partially exposed. The region shown in FIG. 12 is subjected to the partial exposing process, and then subjected to a developing process and a drying process. A blue film layer pattern as shown in FIG. 11 is formed on the surface of the glass substrate (denoted in the figure as a pattern filled with grid lines). FIG. 13 is a schematic view along the cross-section D-D in FIG. 11 after exposure.

It can be seen from the above description that the operating concept of the present disclosure for manufacturing a color filter can be described as: forming a stacked structure composed of several color film layers having different colors in an non-transmitting partitioning region of the color filter in such a way that said stacked structure can prevent light emitted from a backlight from passing through the color filter via the partitioning region.

It should be noted that, the exposing technology as described above adopted for forming the stacked structure, is applied in a non-transmitting partitioning region of a color filter.

One embodiment of the method for manufacturing a color filter of the present disclosure comprises: first in both the sub-pixel light-transmitting regions and the partitioning region therebetween, applying photoresist having the same color, then performing partial exposure and development to the partitioning region, so as to partially remove the photoresist in the partitioning region with part of the photoresist having the same color as the color applied in the sub-pixel light-transmitting regions remaining the partitioning region; next, in both the sub-pixel light-transmitting regions and the partitioning region therebetween, applying photoresist having another color, then performing partial exposure and development to the partitioning region, so as to partially remove the photoresist applied this time in the partitioning region with part of the photoresist having the same color as the color currently applied in the sub-pixel light-transmitting regions; and continuing in a similar way to complete fabrication of respective sub-pixel light-transmitting regions while forming a stacked structure composed of several color photoresist film layers having different colors in the partitioning region in accordance with the above steps, as shown in FIG. 5 to FIG. 12.

The respective sub-pixel light-transmitting regions may be fully exposed or not exposed, so as to form a monochromatic color film in each sub-pixel light-transmitting region. The non-transmitting region is partially exposed, so as to partially remove the photoresist of each color, thus making the thickness of each color film layer in the non-transmitting partitioning region less than the thickness of the color film layer in the light-transmitting regions. As a result, the thickness of the stacked photoresist of different colors may not be too large, which avoids increasing the color filter's thickness.

Of course, the partial exposure can also be performed to the sub-pixel light-transmitting regions.

In summary, it can be seen that, as for no matter the color filter or the manufacturing method thereof, embodiments of the present disclosure can form a stacked structure composed of several color film layers having different colors in the non-transmitting partitioning region of the color filter in such a way that the stacked structure prevent light emitted from a backlight from passing through the color filter via the partitioning region. Thus, it is possible to eliminate of black matrix forming process while providing the function of a black matrix, and accordingly, to reduce manufacturing processes and significantly improve production efficiency.

Embodiments of the present disclosure being thus described, it will be obvious that the same may be varied in many ways. Such variations are not to be regarded as a departure from the spirit and scope of the disclosure, and all such modifications as would be obvious to those skilled in the art are intended to be included within the scope of the following claims.

What is claimed is:

1. A method for manufacturing a color filter which comprises a plurality of pixels each having more than one sub-pixel light-transmitting regions and a non-transmitting partitioning region, wherein the method comprises:
   forming a stacked structure composed of several color film layers having different colors in the non-transmitting partitioning region of the color filter in such a way that the stacked structure can prevent light from passing through the color filter via the partitioning region,
   wherein forming the stacked structure composed of several color film layers having different colors, comprises: in a procedure of processing color photoresist film layers, forming the color film layers in the non-transmitting partitioning region, and forming the stacked structure by stacking the color film layers sequentially,
   forming the color film layers in the non-transmitting partitioning region, comprises partially exposing the photoresist in the non-transmitting partitioning region; and
   the method further comprises fully exposing or not exposing the photoresist in the sub-pixel light-transmitting regions, thereby forming a monochromatic sub-pixel film layer.

2. The method according to claim 1, wherein each of the color film layers has a primary color.

3. The method according to claim 1, wherein colors of the color film layers comprise at least two primary colors out of red, green and blue.

4. The method according to claim 1, wherein the color film layers comprise:
   photoresist film layers of at least two primary colors out of red, green, and blue.

5. The method according to claim 1, wherein forming the stacked structure composed of several color film layers having different colors, comprises:
   applying color photoresist of the same color to both the sub-pixel light-transmitting regions and the non-transmitting partitioning region to form a photoresist film layer;
   partially exposing the photoresist film layer in the non-transmitting partitioning region to form one of the color film layers; and
   fully exposing or not exposing the photoresist film layer in the light-transmitting regions to form a monochromatic sub-pixel film layer.

6. The method according to claim 1, wherein when the colors of the color film layers comprise red, green, and blue, the exposing sequence is: red, green, and blue.

7. A color filter which comprises a plurality of pixels each having more than one sub-pixel light-transmitting regions and a non-transmitting partitioning region, wherein the non-transmitting partitioning region of the color filter is provided with a stacked structure composed of several color film layers having different colors, for preventing light from passing through the color filter via the partitioning region, wherein each of the sub-pixel light-transmitting regions is formed with a monochromatic film layer; and
   the thickness of each of the color film layers in the non-transmitting partitioning region is less than the thickness of the monochromatic film layer in the sub-pixel light-transmitting region.

8. The color filer according to claim 7, wherein each of the color film layers has a primary color.

9. The color filter according to claim 7, wherein colors of the color film layers comprise at least two primary colors out of red, green and blue.

10. The color filter according to claim 7, wherein in the stacked structure, the color film layers are photoresist film layers having different colors.

11. The color filter according to claim 10, wherein the color film layers comprise:
    photoresist film layers of at least two primary colors from red, green, and blue.

12. The color filter according to claim 7, wherein at least one of the color film layer in the non-transmitting partitioning region has the same color as that of the monochromatic sub-pixel film layer of one of the sub-pixel light transmitting regions.

13. The color filter according to claim 12, wherein each of the color film layers has the same color as that of the monochromatic sub-pixel film layer of one of the sub-pixel light-transmitting regions.

14. The color filter according to claim 7, wherein the color film layers in the non-transmitting partitioning region comprises red, green, and blue film layers in this order.

* * * * *